United States Patent
Oberlin et al.

(10) Patent No.: US 7,106,588 B2
(45) Date of Patent: Sep. 12, 2006

(54) POWER ELECTRONIC SYSTEM WITH PASSIVE COOLING

(75) Inventors: Gary E. Oberlin, Windfall, IN (US); Bruce A. Myers, Kokomo, IN (US); Thomas A. Degenkolb, Noblesville, IN (US); Darrel E. Peugh, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 221 days.

(21) Appl. No.: 10/694,191

(22) Filed: Oct. 27, 2003

(65) Prior Publication Data

US 2005/0088822 A1    Apr. 28, 2005

(51) Int. Cl.
H05K 7/20 (2006.01)
H01L 23/427 (2006.01)
H05K 7/06 (2006.01)

(52) U.S. Cl. ............... 361/700; 361/699; 361/717; 361/719; 257/714; 257/715

(58) Field of Classification Search ........ 361/699–703, 361/717–719; 257/705–707, 713, 717–719, 257/E23.088, E23, 714, 715; 174/16.3; 165/80.3, 165/185, 80.4
See application file for complete search history.

(56) References Cited

U.S. PATENT DOCUMENTS

| 3,613,778 | A | * | 10/1971 | Feldman, Jr. ......... 165/104.26 |
| 4,047,198 | A | * | 9/1977 | Sekhon et al. ............. 257/713 |
| 5,007,478 | A | * | 4/1991 | Sengupta ....................... 165/10 |
| 5,095,404 | A | * | 3/1992 | Chao ............................. 361/700 |
| 5,206,792 | A | * | 4/1993 | Reynolds ..................... 361/719 |
| 5,224,356 | A | * | 7/1993 | Colvin et al. .............. 62/259.2 |
| 5,339,214 | A | * | 8/1994 | Nelson ........................ 361/695 |
| 5,847,925 | A | * | 12/1998 | Progl et al. ................. 361/687 |
| 5,851,338 | A | * | 12/1998 | Pushaw ....................... 156/278 |
| 5,949,648 | A | | 9/1999 | Lial |
| 6,038,128 | A | * | 3/2000 | Hood et al. ................. 361/687 |
| 6,043,980 | A | * | 3/2000 | Katsui ......................... 361/695 |
| 6,082,443 | A | * | 7/2000 | Yamamoto et al. .... 165/104.26 |
| 6,084,178 | A | * | 7/2000 | Cromwell ................. 174/35 R |
| 6,212,074 | B1 | * | 4/2001 | Gonsalves et al. .......... 361/717 |
| 6,269,866 | B1 | * | 8/2001 | Yamamoto et al. .... 165/104.26 |
| 6,535,396 | B1 | | 3/2003 | Degenkolb et al. ......... 361/775 |
| 6,665,187 | B1 | * | 12/2003 | Alcoe et al. ................ 361/719 |
| 6,744,640 | B1 | * | 6/2004 | Reis et al. ................... 361/818 |
| 6,813,153 | B1 | * | 11/2004 | Koning et al. .............. 361/700 |
| 2003/0157342 | A1 | | 8/2003 | Myers et al. |
| 2003/0184969 | A1 | | 10/2003 | Itabashi et al. |

FOREIGN PATENT DOCUMENTS

DE        41 06 185        9/1992

OTHER PUBLICATIONS

European Search Report dated Jan. 4, 2005.

* cited by examiner

Primary Examiner—Anatoly Vortman
(74) Attorney, Agent, or Firm—Jimmy L. Funke

(57) ABSTRACT

The present invention relates to an apparatus and method for dissipating heat from high-power electronic devices. The assembly includes a high-current substrate, such as a printed circuit board supporting an electronic device, a heat pipe thermally coupled with the electronic device and an assembly case which also forms a heat sink, and thermal transient suppression material which may be thermally coupled with the electronic device and the heat pipe.

21 Claims, 3 Drawing Sheets

POWER ELECTRONIC SYSTEM WITH PASSIVE COOLING

TECHNICAL BACKGROUND

The present invention generally relates to an assembly and method for dissipating heat generated by electronic devices. More particularly, this invention relates to structures and methods for absorbing and dissipating heat generated by electronic devices.

BACKGROUND OF THE INVENTION

Heat generated by electronic devices during normal operation can cause overheating and device failure if not conducted away from the device. Additionally, transient increased heat generated by electronic devices must also be dissipated, although most electronic devices may handle short durations of increased temperature so that the transient thermal energy can be dissipated over an interval of time. Examples of heat dissipation structures and materials include heat sinks, potting compounds, interface materials and heat pipes.

Heat sinks provide good thermal energy conduction away from electronic devices by providing sufficient thermal conductivity and specific heat. Heat sinks also generally provide a large mass and surface area to radiate absorbed heat into the atmosphere, for example, by using cooling fins or other radiant heat exchange surfaces. Heat sinks are often constructed of aluminum and mounted directly to a surface of the electronic device, or with a thin layer of interface material between the electronic device and the heat sink to ensure good thermal coupling. In order to supplement the emissivity, and/or still air convection of thermal energy into the atmosphere, a fan may be directed across cooling fins, thereby increasing the amount of thermal energy the heat sink may absorb and radiate into the surrounding air.

Heat pipes generally consist of a sealed tube containing a liquid. The inner surfaces of the tube may include a porous capillary wicking material which absorbs the liquid. Thermal energy is absorbed and conducted along the length of the tube. Heat is conducted along the length of the tube by the process of vaporization of the liquid at a segment of the tube which is absorbing heat, flow of the gas to a cooler segment, condensation of the gas to a liquid, and wicking of the liquid through the porous capillary material back to the segment absorbing heat.

Heat pipes are generally efficient at conducting steady state thermal energy away from electronic devices. However, transient thermal energy above the capacity of a heat pipe may cause a condition called dryout in which the heat pipe becomes severely less efficient at thermal transfer and stops functioning. Dryout occurs when all, or most of the liquid contained in the heat pipe remains in the vapor state and reduced condensation and wicking of the liquid through the porous capillary material occurs to carry thermal energy from the heat absorbing segment along the length of the tube.

Potting or encapsulation material may be used for absorption of transient thermal energy dissipation from electronic devices. Two mechanisms of this material absorb transient thermal energy: inherent specific heat and latent heat as the material undergoes a phase change. In the case of encapsulation material, a solid-to-solid or solid-to-liquid phase change of the material provides high latent heat absorption to quickly transport or absorb heat away from an electronic device. Advantageously, such materials may also provide an electrical insulating characteristic so that it may be in direct contact with an electrical circuit.

Such encapsulation materials that provide a solid to liquid phase change require a closed barrier in order to contain the material in its liquid state. Additionally, while such material may effectively accept the heat transfer of rare periodic transient thermal energy, the material alone does not provide a further pathway to carry the heat away from the encapsulation material. Thus, once the material absorbs enough thermal energy to phase change all the solid to a liquid, no additional heat transfer capacity remains.

SUMMARY OF THE INVENTION

The present invention relates to an apparatus and method for dissipating heat from high-power electronic devices. The innovative assembly includes a high-current substrate, such as a printed circuit board supporting an electronic device, a heat pipe thermally coupled with the electronic device and assembly case which also forms a heat sink, and thermal transient suppression material which may be thermally coupled to the electronic device and the heat pipe.

High-power electronic devices associated with high-current printed circuit boards generate heat during normal and transient operation that may cause overheating and device failure if the thermal energy is not sufficiently conducted away from the electronic device. The combination of utilizing passive heat pipes with thermal transient suppression material to dissipate heat from electronic devices on high-current printed circuit boards provides an efficient, low-cost, and compact design. Applications such as in the automotive environment, for example, energy conversion or motor control power devices, require low-cost, compact and reliable heat dissipation such as that provided by the present inventive assembly.

Advantageously, the thermal transient suppression material provides excellent transfer of transient thermal energy away from the electronic device while the heat pipe provides efficient transfer of steady state thermal energy from the electronic device and transfer of thermal energy from the thermal transient suppression material over a period of time so that the material may again return to a solid state and provide renewed transient thermal energy absorption.

A substrate, which may be capable of carrying a high-current, and a high-power electronic device mounted to the substrate may be enshrouded by a clamshell style enclosure or case. The case may also function as a heat sink, including finned surfaces for dissipating heat to the surrounding atmosphere. Heat pipes may be located between the electronic device and case such that a first segment of the heat pipe is in thermal contact with the electronic device and a second segment of the heat pipe is held firmly in contact with the case.

Thermal energy may be conducted from the electronic device into the first segment of the heat pipe and out of the second segment of the heat pipe and into the case. An elastomeric or other compressible material may be located between the case and the first segment of the heat pipe in order to ensure firm thermal contact between the first segment of the heat pipe and the electronic device. Additionally, a thermally conductive coupling member may be used to couple the first segment of the heat pipe to the electronic device or to couple the electronic device to the case. For example, a saddle-shaped coupling member may be used to accommodate thermally coupling of a circular cross-section heat pipe with a generally planar electronic device surface. Additionally, a thermally conductive coupling member may be used to couple the second segment of the heat pipe to the case. The thermally conductive coupling member may also be integral with the case or other heat sink.

The substrate which supports the electronic device may be, for example, a high-current print circuit board such as that disclosed by U.S. Pat. No. 6,535,396 issued Mar. 18, 2003, to Degenkolb et al., assigned to the assignee of the present invention, the disclosure of which is hereby incorporated by reference herein. The case may also include a surface which is in thermal contact with the electronic device. For example, a pedestal or other projection may extend from the case to a surface of the electronic device.

Further heat dissipation, especially transient thermal energy, may also be dissipated by a thermal transient suppression material which may also serve as an encapsulation material. The thermal transient suppression material may be in contact with any or all of the electronic device, heat pipe, substrate and case.

Such a thermal transient suppression material is disclosed by U.S. patent application Ser. No. 10/075,981, now U.S. Pat. No. 6,703,128 B2, entitled "Thermally-Capacitive Phase Change Encapsulant for Electronic Devices," assigned to the assignee of the present invention, the disclosure of which is hereby incorporated herein by reference. This exemplary material includes metallic alloy particles that provide heat absorption through a solid-to-liquid phase change while having a base material that maintains the form of a semisolid gel so that the molten metallic particles are contained by the overall material structure without requiring a physical closed barrier.

In one form thereof, the present invention provides an electronic assembly including a substrate; an electronic device having a first, second and third surface, the electronic device supported by the substrate; a heat pipe having a first and second segment, the first segment thermally coupled with the first surface of the electronic device; and a thermal transient suppression material coupled with at least the second surface of the electronic device, the material having a component capable of absorbing thermal energy by phase change from a solid to a liquid and the material being self contained.

In another form thereof, the present invention provides an electronic assembly, including a high-current circuit board; a first electronic device supported by the circuit board and having a first, second and third surface; a heat conductive case having a first and second portion adjacent opposite sides of the circuit board; and a first heat pipe having a first segment thermally coupled with the first surface of the first electronic device and a second segment thermally coupled with the first case portion.

In yet another form thereof, the present invention provides a method of conducting heat away from an electronic device, including the steps of thermally coupling the heat pipe between the electronic device and a heat sink, and coupling a thermal transient suppression material to the electronic device and the heat pipe.

Advantageously, the present invention provides high-performance cooling for proper operation and reliable performance of very high-current and power-dissipating electronics. Additionally, the present invention may utilize only passive heat dissipation materials and assemblies, thereby eliminating the cost, complexity and space requirement of external mechanical pumps, fluid radiators, and the associated fluid containment and routing plumbing.

BRIEF DESCRIPTION OF THE DRAWINGS

The present invention will now be described, by way of example, with reference to the accompanying drawings, in which.

Figure 1:
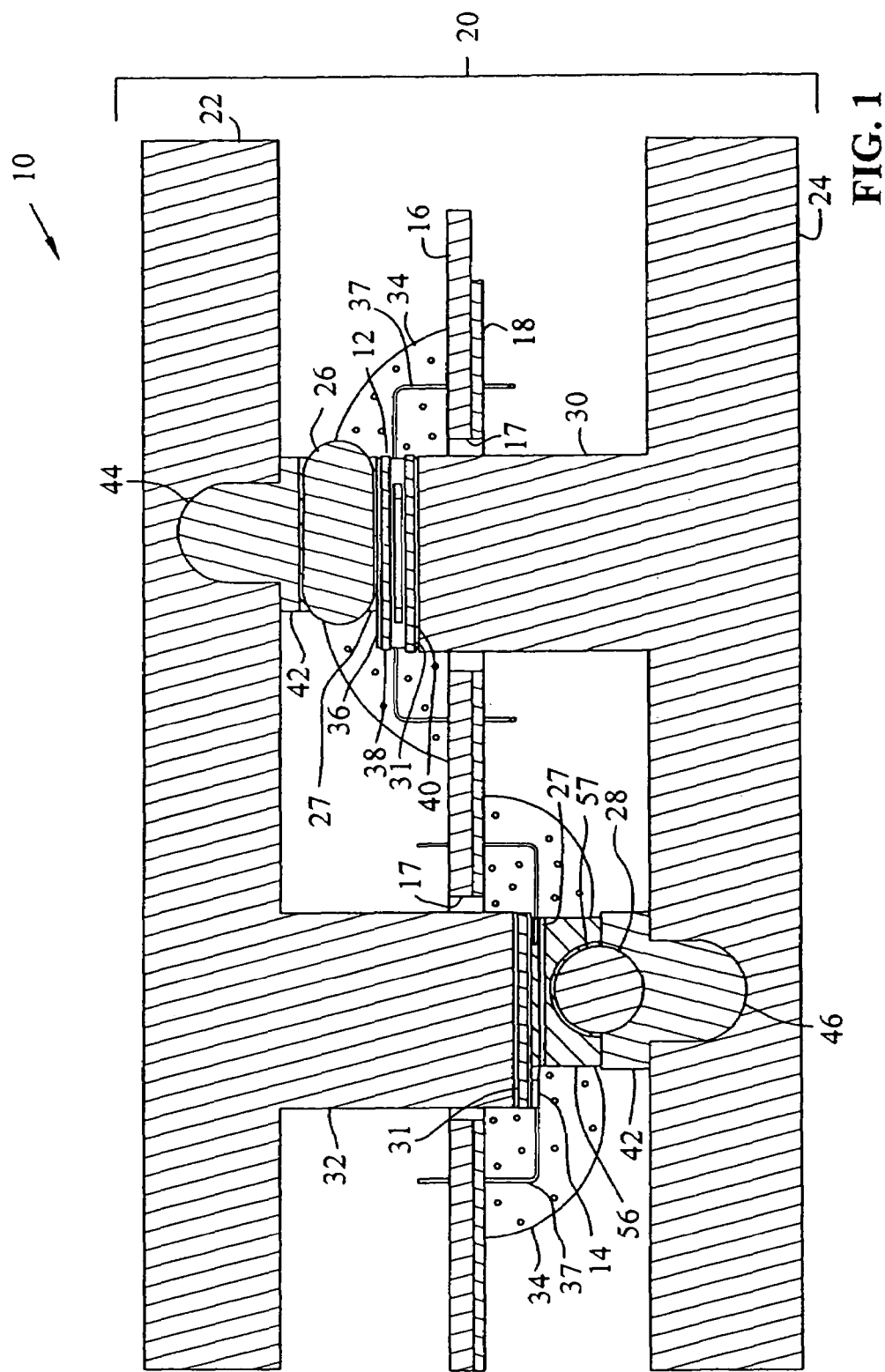
FIG. 1 is a cross-sectional view of a first exemplary electronic assembly according to the present invention.

Corresponding reference characters indicate corresponding parts throughout the several views. Although the drawings represent embodiments of the present invention, the drawings are not necessarily to scale and certain features may be exaggerated in order to better illustrate and explain the present invention. The exemplifications set out herein illustrate embodiments of the invention and such exemplifications are not to be construed as limiting the scope of the invention in any manner.

DESCRIPTION OF INVENTION

The embodiments disclosed below are not intended to be exhaustive or limit the invention to the precise forms disclosed in the following detailed description. Rather, the embodiments are chosen and described so that others skilled in the art may utilize their teachings.

Figure 2:
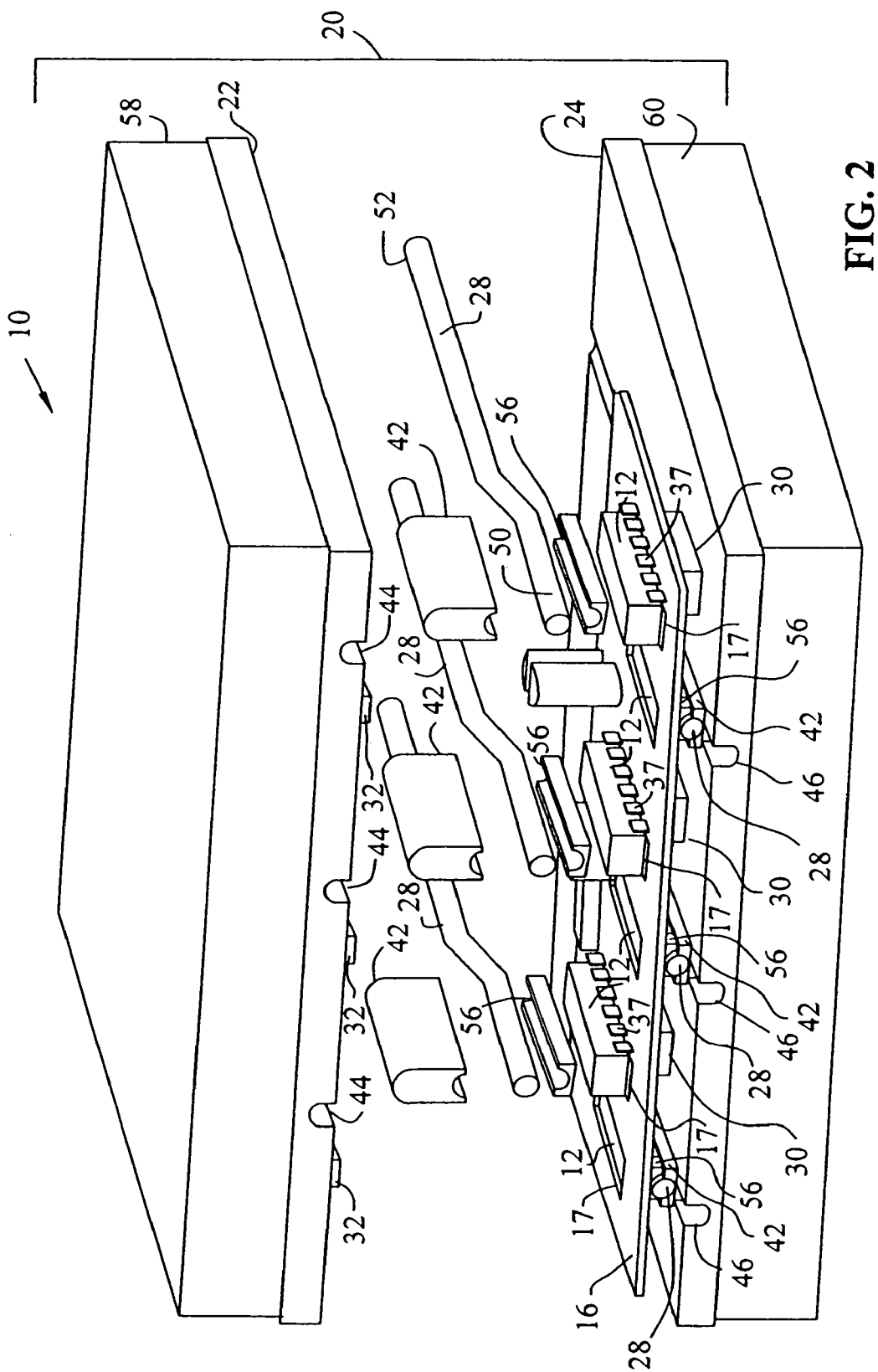
FIG. 2 is an exploded perspective view of the first exemplary electronic assembly shown in FIG. 1.

FIGS. 1 and 2 show first exemplary electronic assembly 10 which provides heat dissipation for first electronic device 12 and second electronic device 14. Electronic devices 12 and 14 are supported by opposite sides of substrate 16 which may include high-current conductors 18. Electronic devices 12 and 14 and substrate 16 may be enshrouded by case 20. Case 20 may include first case portion 22 and second case portion 24. Heat dissipation features of first electronic assembly 10 include first heat pipe 26 having an oval cross-section, second heat pipe 28 having a circular cross-section, first pedestal 30, second pedestal 32, thermal coupling members 56, and transient thermal suppression material 34. Pedestals 30 and 32 may be coupled to or integrally formed with second case portion 24 and first case portion 22, respectively.

FIG. 1 is a cross-sectional view of first exemplary electronic assembly 10 illustrating two exemplary thermal dissipation configurations. On the left, device 14 is shown thermally coupled with pedestal 32, thermal coupling member 56, heat pipe 28, and suppression material 34. On the right, device 12 is shown thermally coupled with pedestal 30, heat pipe 26, and suppression material 34. FIG. 2 is an exploded perspective view of first electronic assembly 10 which includes only the first exemplary thermal dissipation configuration which is illustrated on the left side of FIG. 1.

Substrate 16 may be, for example, a high-current printed circuit board, such as that disclosed by U.S. Pat. No. 6,535,396, referenced above, and having a segmented conductive bus substrate, or substrate 16 may be a typical printed circuit board having conductors 18 capable of providing the high current required for components which generate thermal energy that must be dissipated. Electronic devices 12 and 14 may be mounted conventionally on substrate 16, as shown in FIGS. 1 and 2, or by other methods known in the art, for example, surface mounted or mounted in a chip carrier. Additionally, devices 12 and 14 may be mounted on opposite sides of substrate 16, as shown in FIGS. 1 and 2, or on one side of substrate 16.

First electronic device 12 includes three surfaces, specifically, first surface 36, second surface 38, and third surface 40; however, first electronic device 12 may have fewer or additional surfaces depending on the component design.

Referring to FIGS. 1 and 2, first electronic device 12 is thermally coupled with first heat pipe 26. Specifically, first surface 36 of first electronic device 12 is thermally coupled with heat pipe 26. The thermal coupling may occur by direct physical contact between heat pipe 26 and first surface 36, or may be provided through another material or structure, for example, thermally conductive interface potting material 27 which ensures against any thermal conductivity limiting physical gaps between heat pipe 26 and first surface 36.

First heat pipe 26 may include a flattened oval cross-section for coupling with first surface 36. The flattened cross-section of heat pipe 26 provides a larger planar contact surface than that provided by the circular cross-section of second heat pipe 28. Other cross-sectional shapes and arrangements of heat pipe 26 are also possible, for example, a rectangular cross-section. Heat pipes 26 and 28 are sized to provide sufficient thermal capacity to handle both the steady state thermal energy of electronic device 12 or 14 and to provide thermal capacity for absorbing and transferring over a period of time the transient thermal energy from device 12 or 14 that is absorbed by transient thermal suppression material 34.

Elastomeric spring 42 may be located between first case portion 22 and first heat pipe 26 in order to provide a force against heat pipe 26 to hold it in firm thermal contact with first electronic device 12. Elastomeric spring 42 may be, for example, a resilient polymer material or another compressible material which is resilient to and possibly conducts thermal energy. As shown in FIGS. 1 and 2, a recess 44 may be formed in first case portion 22 to receive elastomeric spring 42, thereby holding the spring in position and alignment with heat tube 26 and electronic device 12.

Referring briefly to FIG. 2, heat pipe 28 includes a first segment 50 and a second segment 52. Heat pipe 28 may be similar to heat pipe 26 except that heat pipe 28 includes a circular rather than a flattened oval cross-section along segment 50. Referring again to FIG. 1, first segment 50 of heat pipe 26 is in contact with first electronic device 12 and absorbs heat dissipated by first electronic device 12. Heat pipe 26 conducts the absorbed thermal energy along the length of heat pipe 26 to second segment 52 (not shown in FIG. 1) which may be in contact with first case portion 22 or another heat sink or dissipation device which absorbs heat from heat pipe 26.

First device 12 may be partially or completely enshrouded by an encapsulation material 34, for example, thermal transient suppression material which is thermally coupled with first device 12 and provides absorption of continuing and transient thermal energy. Certain thermal transient suppression materials are especially capable of absorbing transient thermal energy by making use of a phase change of the material, for example, the encapsulant disclosed by U.S. patent application Ser. No. 10/075,981, which is referenced above.

Thermal transient suppression material 34 may be coupled with second surface 38 of first electronic device 12 and, as shown in FIG. 1, may also be in contact with other portions of first electronic device 12, for example, first surface 36 and device connection leads 37, which may also dissipate heat from device 12 to material 34. Additionally, thermal transient suppression material 34 also may be in contact with other components of first electronic assembly 10, for example, substrate 16, first heat pipe 26, and pedestal 30. By providing thermal contact between thermal transient suppression material 34 and first heat pipe 26, heat pipe 26 advantageously provides a thermal energy path away from device 12 and material 34 so that material 34 may return to a solid phase and regain thermal capacity for absorption of transient thermal energy from device 12. Thermal transient suppression material 34 may also serve the purpose of isolating first electronic device 12 from the environment.

A thermally conductive coupling member such as first pedestal 30, may be in thermal contact with second surface 40 of first electronic device 12. In first exemplary electronic assembly 10, first pedestal 30 and second pedestal 32 are integrally formed with second case portion 24 and first case portion 22, respectively. Pedestal 30 may extend through an aperture 17 defined by substrate 16 and be thermally coupled with third surface 40, or another portion of first electronic device 12. Alternatively, pedestal 30 may be thermally coupled through substrate 16, or another material capable of sufficient thermal conduction. Thermally conductive interface material 31 may also be provided between device 12 and pedestal 30 to ensure good thermal conductivity.

Pedestal 30 provides a thermal conduction path away from first electronic device 12 and may also provide mechanical support for substrate 16 and/or first electronic device 12, for example, against the spring force of elastomeric spring 42. Pedestal 30 and second case portion 24, as well as pedestal 32 and first case portion 22, may be constructed of aluminum, cast aluminum, magnesium, or another substantially rigid material which is capable of dissipating heat from high-power electronic devices.

Second electronic device 14 is mounted to substrate 16 of first exemplary electronic assembly 10 on a side opposite that to which first electronic device 12 is mounted. Advantageously, this configuration allows second heat pipe 28, which is thermally coupled to second electronic device 14, to be conveniently located near and thermally coupled to second case portion 24, while first heat pipe 26 is thermally coupled to first case portion 22, thereby dividing heat dissipation from heat pipes 26 and 28 between the two case portions 22 and 24.

Additionally, thermal coupling member 56 is located between second heat pipe 28 and second electronic device 14. Thermal coupling member 56 provides for thermal coupling between the circular cross-section of heat pipe 28 and the planar surface of second electronic device 14, thereby improving the area of thermal contact than if second heat pipe 28 directly contacted second electronic device 14. Thermally conductive interface material 57 may be provided between heat pipe 28 and thermal coupling member 56 in order to minimize physical gaps and provide good thermal conductivity between the components.

Elastomeric spring 42 resting in second spring recess 46 of second case portion 24 holds second heat pipe 28 and thermal coupling member 56 in thermal contact with a first side of second electronic device 14. Pedestal 32, which in first exemplary electronic assembly 10 is integrally formed with first case portion 22, is coupled with second electronic device 14 on a side opposite second heat pipe 28. Pedestal 32 may provide a thermal conduction path as well as mechanical support of substrate 16 and/or second electronic device 14. In order to achieve thermal contact between device 14 and pedestal 32, pedestal 32 may also extend through one of apertures 17 defined through substrate 16.

Figure 3:
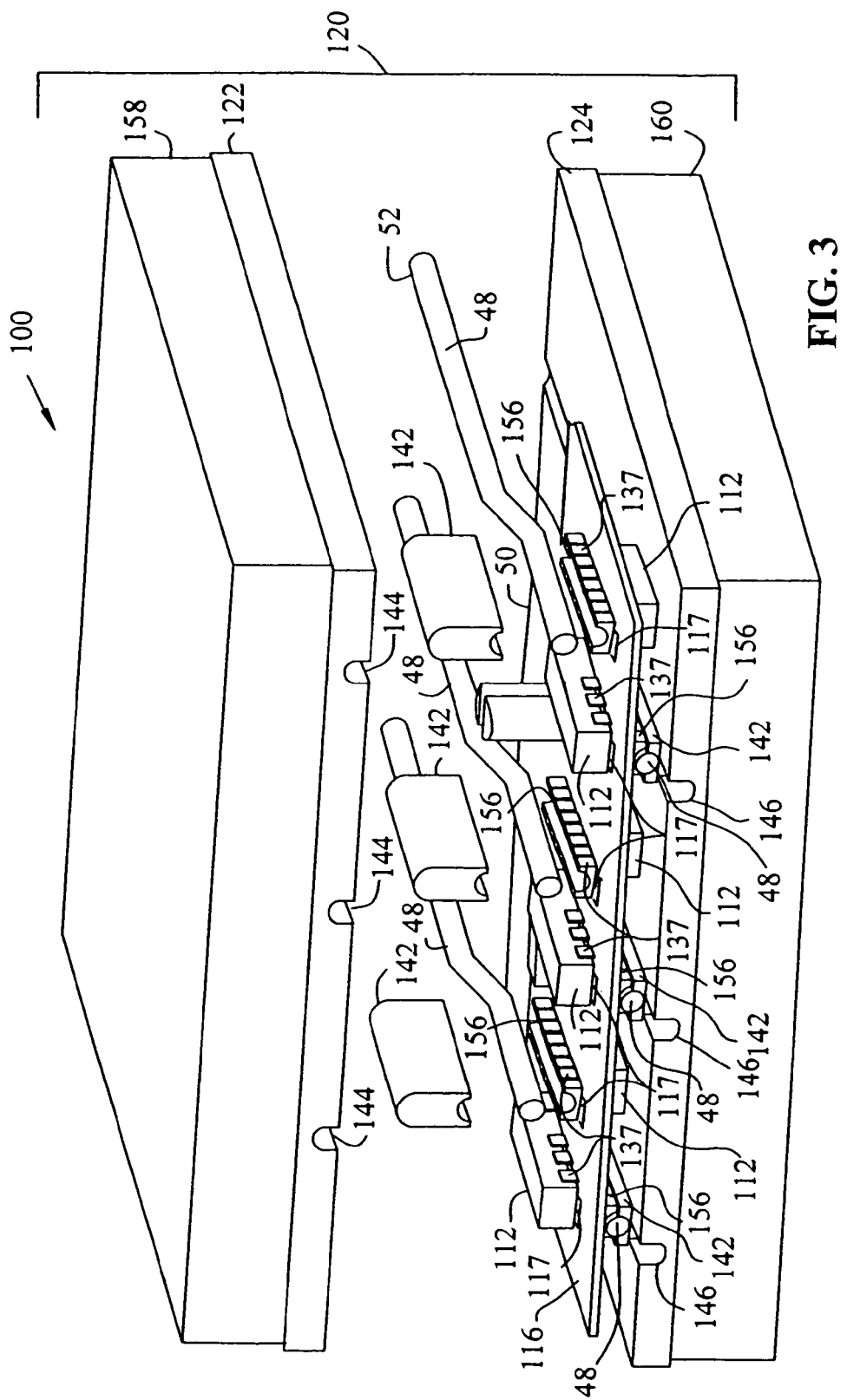
FIG. 3 is an exploded perspective view of a second exemplary electronic assembly according to the present invention.

FIG. 3 shows a perspective exploded view of second exemplary electronic assembly 100. Second exemplary electronic assembly 100 also includes heat pipes 48 which are coupled between electronic devices 112 and either first case portion 122 or second case portion 124 of case 120. Electronic assembly 100 may also include other heat dissipation devices, for example, similar to first exemplary electronic assembly 100, i.e., thermal transient suppression material (not shown) and heat transfer pedestals (not shown).

One substantial difference in second exemplary electronic assembly 100 is that heat pipe 48 may be thermally coupled to a surface of electronic device 112 from a side of substrate 116 that is opposite a main body of electronic device 112, i.e., the side of device 112 that faces aperture 117 defined through substrate 116. For example, a thermal coupling member 156 may be located in aperture 117, and between connection leads 137 of electronic device 112, and thus protrude through a side of substrate 116 which is opposite electronic device 112. With this arrangement, thermal coupling member 156 may be thermally coupled with devices 112 and heat pipe 48. Thermal coupling member 156 may also be shaped to maximize the surface area in contact with heat pipe 48, for example, thermal coupling member 156 may have an arcuate receptacle for receiving first segment 50 of heat pipe 48, as shown in FIG. 2.

Elastomeric spring 142 may be received in a recess 146 or 144 of first case portion 122 and second case portion 124, respectively. Elastomeric spring 142 may be used to firmly thermally couple heat pipe 48 with thermal coupling member 156 and/or electronic device 112. On the side opposite heat pipe 48, electronic device 112 may also be thermally coupled to first case portion 122 or second case portion 124, or a pedestal (not shown) such as pedestal 30 or 32 of FIGS. 1 and 2, or other heat dissipation device coupled thereto or independent thereof.

Referring alternatively to FIGS. 2 and 3, to further provide effective heat dissipation, case portions 22, 122 and 24, 124 may also include cooling fins 58, 158 and 60, 160, respectively, for radiating heat from case portions 122 and 124 into the surrounding atmosphere. As can be understood from FIG. 3, case portions 122 and 124 not only provide heat dissipation, but may also provide for enshrouding, packaging or other protection of the components of second exemplary electronic assembly 100 as case portions 122 and 124 provide a clamshell style case 120 that enshrouds the various components.

Either first or second exemplary electronic assemblies 10 and 100 may also include devices having more than one heat pipe coupled to each device. Specifically, each device may have a heat pipe coupled to opposite sides, or more than one heat pipe coupled to a single side, thus providing greater thermal dissipation for the device than a single similarly sized heat pipe could provide.

Although described in the exemplary embodiments, it will be understood that various modifications may be made to the subject matter without departing from the intended and proper scope of the invention. Accordingly, it will be understood that other electronic assemblies incorporating an embodiment of the present invention may fall within the scope of this invention, which is defined by the appended claims.

The invention claimed is:

1. An electronic assembly, comprising:
   a substrate;
   an electronic device having a first, second and third surface, said electronic device supported by said substrate;
   a heat pipe having a first and second segment, said first segment thermally coupled with said first surface of said electronic device;
   a thermal transient suppression material thermally coupled with said first segment of said heat pipe and at least said second surface of said electronic device, said material having a component capable of absorbing thermal energy by phase change from a solid to a liquid and said material being self contained, wherein said thermal transient suppression material includes sufficient thermal capacity for receiving transient thermal energy produced by said electronic device, and
   said heat pipe includes sufficient thermal capacity for receiving non-transient thermal energy produced by said electronic device and thermal energy received by said thermal transient suppression material;
   a heat dissipation device thermally coupled with said second portion of said heat pipe, wherein said heat dissipation device comprises a heat sink having cooling fins, and said heat sink comprises a first case portion; and
   an elastomeric spring compressed between said first case portion and said first segment of said heat pipe, thereby maintaining said first portion of said heat pipe in thermal contact with said first surface of said electronic device.

2. The electronic assembly of claim 1, wherein said first case portion includes a recess, said recess receiving said elastomeric material.

3. The electronic assembly of claim 1, further comprising:
   a second case portion, said second case portion being thermally conductive; and
   a thermally conductive coupling member thermally coupling said third surface of said electronic device with said second case portion.

4. The electronic assembly of claim 3, wherein said first surface and said third surface are located on opposite sides of said electronic device.

5. The electronic assembly of claim 4, wherein said substrate defines an aperture and said thermally conductive coupling member protrudes through said aperture.

6. The electronic assembly of claim 3, wherein said first case portion and said second case portion substantially enshroud said substrate and said electronic device therebetween.

7. The electronic assembly of claim 6, wherein said first case portion and said second case portion further substantially enshroud said heat pipe.

8. The electronic assembly of claim 1, wherein said heat pipe includes a porous interior layer and liquid which is absorbable by said porous interior layer to provide heat conduction from said first segment to said second segment without requiring a mechanical pump.

9. The electronic assembly of claim 1, further comprising at least a second heat pipe thermally coupled with at least one of said first surface and said third surface of said electronic device.

10. The electronic assembly of claim 1, wherein said substrate includes a high current printed circuit board.

11. An electronic assembly, comprising:
    a high current circuit board;
    a first electronic device supported by said circuit board and having a first, second and third surface;
    a heat conductive case having a first and second portion adjacent opposite sides of said circuit board;
    a first heat pipe having a first segment thermally coupled with said first surface of said first electronic device and a second segment thermally coupled with said first case portion; and a thermal transient suppression material in thermal contact with said second surface of said electronic device and said first segment of said first heat pipe, wherein said thermal transient suppression material includes sufficient thermal capacity for receiving transient thermal energy produced by said first electronic device, and said first heat pipe includes sufficient thermal capacity for receiving non-transient thermal energy produced by said first electronic device and thermal energy received by said thermal transient suppression material, and wherein said second case portion is in thermal contact with said third surface of said electronic device.

12. The electronic assembly of claim 11, wherein said first surface and said second surface are located on opposite sides of said electronic device.

13. The electronic assembly of claim 12, further comprising a thermally conductive coupling member coupled between said second case portion and said third surface of said electronic device, and wherein said circuit board defines an aperture and said coupling member protrudes through said aperture.

14. The electronic assembly of claim 11, further comprising an elastomeric spring compressed between said first segment of said heat pipe and said first case portion.

15. The electronic assembly of claim 11, further comprising:
 a second electronic device supported by said circuit board; and
 a second heat pipe having a first segment and a second segment, said first segment of said second heat pipe thermally coupled with said second electronic device.

16. The electronic assembly of claim 15, wherein said second segment of said second heat pipe is thermally coupled with at least one of said first case portion and said second case portion.

17. The electronic assembly of claim 16, wherein said first electronic device and said second electronic device are coupled to opposite sides of said circuit board.

18. The electronic assembly of claim 11, wherein said first electronic device includes electrically conductive leads and said thermal transient suppression material is thermally coupled with said leads.

19. The electronic assembly of claim 11, wherein at least one of said first and second case portions comprises cooling fins.

20. The electronic assembly of claim 11, further comprising at least a second heat pipe coupled with at least one of said first surface and said second surface of said first electronic device.

21. An electronic assembly, comprising:
 a substrate;
 an electronic device having a first, second and third surface, said electronic device supported by said substrate;
 a heat pipe having a first and second segment, said first segment thermally coupled with said first surface of said electronic device;
 a thermal transient suppression material thermally coupled with said first segment of said heat pipe and at least said second surface of said electronic device, said material having a component capable of absorbing thermal energy by phase change from a solid to a liquid and said material being self contained; and
 a thermally conductive coupling member coupling said first surface of said electronic device and said first segment of said heat pipe,
 wherein said substrate defines an aperture and wherein said first surface of said device faces said aperture and said thermally conductive coupling member protrudes through said aperture.

* * * * *